United States Patent [19]

Kotecha et al.

[11] 4,336,603
[45] Jun. 22, 1982

[54] THREE TERMINAL ELECTRICALLY ERASABLE PROGRAMMABLE READ ONLY MEMORY

[75] Inventors: Harish N. Kotecha, Essex Junction; Francis W. Wiedman, III, Stowe, both of Vt.

[73] Assignee: International Business Machines Corp., Armonk, N.Y.

[21] Appl. No.: 160,530

[22] Filed: Jun. 18, 1980

[51] Int. Cl.³ .............................................. G11C 11/40
[52] U.S. Cl. ...................................... 365/182; 365/185
[58] Field of Search .................... 365/182, 184, 185

[56] References Cited

U.S. PATENT DOCUMENTS

| | | | |
|---|---|---|---|
| 3,914,855 | 10/1974 | Cheney et al. | 29/571 |
| 3,972,059 | 7/1976 | DiStefano | 357/6 |
| 4,014,675 | 8/1978 | DiMaria et al. | 357/54 |
| 4,161,039 | 7/1979 | Rössler | 365/185 |

OTHER PUBLICATIONS

*Electronics* "Double-Diffused MOS Achieves Microwave Gain" Feb. 1971, pp. 99-104 by T. P. Cauge.

*Primary Examiner*—Terrell W. Fears
*Attorney, Agent, or Firm*—Stephen J. Limanek

[57] ABSTRACT

A memory system is provided for charging and discharging small cells each of which has only three terminals with a charge injector controlled by a low single polarity voltage. Each of the cells includes a transistor having a current carrying electrode and a floating gate, with a control gate arranged so that a first capacitor is serially connected with a second capacitor between the current carrying electrode and the control gate, with one of the capacitors having a substantially larger capacitance than that of the other capacitor and with the other capacitor including a charge injector. The common point between the first and second capacitors is connected to the floating gate. The charge injector may include a single graded or stepped composition region or two such regions disposed near opposite faces or plates of the other capacitor, or more particularly the injector may include silicon rich regions near one or both faces of a layer of silicon dioxide.

21 Claims, 6 Drawing Figures

THREE TERMINAL ELECTRICALLY ERASABLE PROGRAMMABLE READ ONLY MEMORY

DESCRIPTION

1. Technical Field

This invention relates to integrated semiconductor circuits and more particularly to a storage system or transistor array which may be used, e.g., in electrically erasable programmable read only memories (EEPROM), in non-volatile random access memories, or in electrically alterable programmable logic arrays.

2. Background Art

Integrated semiconductor circuits, particularly systems or arrays having transistors each of which represents a binary digit of information, as in read only memories (ROM), have achieved high device or cell densities.

In, e.g., U.S. Pat. No. 3,914,855, filed May 9, 1974 there is described a read only memory wherein the array has transistors made with a thin gate dielectric exhibiting a low threshold voltage for storing a 1 digit of binary information and transistors made of a thick gate dielectric exhibiting a considerably higher threshold voltage for storing the other digit of binary information. Also described is a read only memory wherein ion impurities are implanted to render selected devices inoperative, as defining a 1 digit of binary information, while the remaining devices are operative devices of transistors defining the other digit of binary information.

In U.S. Pat. No. 4,161,039, filed Feb. 6, 1978, there is disclosed a memory array utilizing field effect transistors (FET) where information is stored in floating gates and the channel region is made to a short length by employing double-diffusion processing techniques, as disclosed in more detail in "Electronics", Feb. 15, 1971, at pages 99-104. This memory is not a simple read only memory but one that can be reprogrammed after erasing the stored information with ultraviolet light.

Commonly assigned U.S. Pat. No. 3,972,059, filed Dec. 28, 1973 by T. H. DiStefano discloses a charge store FET memory suitable for operation in a read only mode which includes a floating gate and a write gate separated by a first insulating layer having a low band gap at the write gate and an erase gate separated from the floating gate by a second insulating layer having a low band gap at the floating gate.

Commonly assigned U.S. Pat. No. 4,104,675, filed June 21, 1977 by D. J. DiMaria et al discloses a non-destructive long-term storage system using a single graded energy band gap structure in which each cell may be driven by a low voltage.

In commonly assigned U.S. patent application Ser. No. 124,003 filed Feb. 25, 1980 by D. J. DiMaria there is disclosed a non-destructive long-term storage system using a dual charge injector or dual graded energy band gap structure in each cell which is driven by a low voltage.

In commonly assigned U.S. patent application Ser. No. 153,359 filed May 27, 1980 by H. N. Kotecha, there is disclosed an improved system for charging and discharging, or writing and erasing, a conductive plate with a charge injector controlled by a low single polarity voltage. In a preferred embodiment of the invention, the conductive plate is a floating gate of a field effect transistor which also includes first and second or dual control gates. A single or double graded band gap layer, such as a silicon rich layer of silicon dioxide, is disposed only between the floating gate and the first control gate forming a capacitor having a given capacitance with a larger capacitor disposed between the second control gate and the floating gate. These cells or transistors may be used in an array for storing for long periods of time, on the order of 10 years or more, binary digits of information representing a 0 or a 1 depending upon whether a charge is stored on the floating gate. When using these cells in a memory array, information may be written into or erased from each of the cells individually or a blanket erase may be employed for the entire or a selected section of the array.

Disclosure of the Invention

It is an object of this invention to provide an improved field effect transistor or metal-insulator-semiconductor (MIS) device which stores in a non-volatile mode binary information that is electrically written or erased with the use of only three terminals or ports.

It is another object of this invention to provide an improved electrically erasable programmable read only memory or non-volatile random access memory wherein data can be written or erased selectively having applications in both memory and logic circuits.

It is still another object of this invention to provide an improved electrically erasable read only memory having smaller storage cells with charge being derived from a semiconductor substrate.

It is a further object of this invention to provide an improved electrically erasable read only memory having three terminal cells with a floating gate or charge trapping layer wherein substantially all charges produced by a charge injector driven by a low voltage are trapped on the floating gate or layer.

Yet another object of the invention is to provide an improved electrically erasable read only memory having three terminal cells wherein charge is trapped on the floating gate of the cell and erased therefrom by a low voltage injector employing a single polarity pulse.

In accordance with the teachings of this invention an improved memory system is provided for charging and discharging small cells each of which has only three terminals with a charge injector controlled by a low single polarity voltage. Each of the cells includes a transistor having first and second current carrying electrodes, a floating gate and a control gate arranged so that a first capacitor is serially connected with a second capacitor between one of the current carrying electrodes and the control gate, with the second capacitor having a substantially larger capacitance than that of said first capacitor and with the first capacitor including a charge injector. The charge injector may include a single graded or stepped composition region or two such regions disposed near opposite faces or plates of the first capacitor, or more particularly the injector may include silicon rich regions near one or both faces of a layer of silicon dioxide. In an embodiment of the invention, the transistor includes a source and a drain defining a channel region in a semiconductor substrate with a control gate disposed over a portion of the channel region and insulated therefrom. A floating gate is disposed over the remaining portion of the channel region and insulated therefrom, over the control gate and over the drain and insulated therefrom, with a charge injector being disposed between the control gate and the floating gate. In a second embodiment, the drain of the transistor has a bit line connected thereto which is also disposed over and insulated from the floating gate so as to form a capacitor having a large capacitance value. In a third embodiment, the floating gate is disposed between the control gate and the channel region and the charge injector is disposed between a current carrying electrode and the floating gate.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
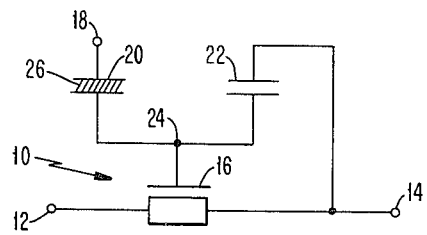
FIG. 1 is a schematic circuit of the present invention.

Referring to FIG. 1 of the drawings in more detail, there is shown a schematic circuit of the cell of the present invention which includes a field effect transistor 10 having a first current carrying electrode 12 and a second current carrying electrode 14 and a floating gate 16. A control terminal 18 is connected to the second current carrying electrode 14 through first and second serially connected capacitors 20 and 22, respectively, with the common point or node 24 between the serially connected capacitors 20 and 22 being connected to the floating gate 16. The second capacitor 22 has a capacitance substantially, e.g., several times, larger than the magnitude of the capacitance of the first capacitor 20. Furthermore, disposed within the first capacitor 20 is a charge or electron injector system 26 of the type disclosed, e.g., in the above identified U.S. patent application filed by D. J. DiMaria or in the above identified U.S. Patent filed by D. J. DiMaria et al. The injector system 26 may be of the single or dual type injector system depending upon the intended application. If the injector system 26 is to be a dual injector system, the system 26 may include a given layer of silicon dioxide with a silicon rich layer of silicon dioxide disposed between the given layer of silicon dioxide and each of the plates of the first capacitor 20. If a single injector system is to be employed then only one of the silicon rich layers of silicon dioxide would be provided between the given silicon dioxide layer and one of the two plates of the first capacitor 20.

In the operation of the memory cell illustrated in FIG. 1 of the drawing, to write a binary digit 1 in the cell a voltage of approximately 15 volts is applied to the second current carrying electrode 14 with the control terminal 18 at ground potential and the first current carrying electrode floating or open. Since the capacitance of the second capacitor 22 is substantially larger than the capacitance of the first capacitor 20 most of the applied voltage will be across the first capacitor 20. Thus, with the charge injector being disposed within the first capacitor 20, the voltage drop across the first capacitor 20 readily produces charge in the form of electrons on the floating gate 16. As is known the electrons on floating gate 16 cause the magnitude of the threshold voltage of transistor 10 to increase. Accordingly, with a voltage of, e.g., +5 volts, applied to the control terminal 18 and the second current carrying electrode 14 precharged to +5 volts, current will not pass through the transistor 10 between the first and second current carrying electrodes and, therefore, the voltage at the second carrying electrode 14 will remain at approximately +5 volts. To erase the 1 binary digit from the cell, i.e., to remove the charge from the floating gate 16, a voltage of approximately 17.5 volts is applied to the control terminal 18 with the second current carrying electrode 14 being at ground potential. To write the binary digit 0 into the memory cell, all of the terminals 12, 14 and 18 are placed at zero potential. To read the 0 binary digit a voltage of +5 volts is again applied to the control terminal 18 and the second current carrying electrode 14 is precharged to +5 volts. In this instance, since the floating gate 16 does not have a negative charge, transistor 10 has a lower threshold voltage, thus, current will flow between the first and second current carrying electrodes 12 and 14, respectively, discharging electrode 14. It should be noted that to detect the state of the cell during the reading operation the voltage on the second current carrying electrode 14 is a precharged voltage with the current carrying electrode 14 being in a floating condition, but other detecting techniques may be employed if desired.

It can be seen that the cell illustrated in FIG. 1 of the drawings, using only the three terminals as in a field effect transistor, is capable of storing information in a non-volatile manner and is particularly useful as an electrically erasable programmable read only memory. This cell is denser than the four terminal or port non-volatile cell disclosed in the above identified Kotecha patent application since this cell requires only one control terminal or gate with the other control terminal or gate being integrated into one of the current carrying electrodes of transistor 10 and requires fewer contacts.

It should also be noted that the capacitive structures 20 and 22 may be interchanged in which case the 1 binary digit of information would be stored in the floating gate 16 by applying the voltage of approximately +15 volts to the control terminal 18 with the second current carrying electrode 14 at ground potential, and the erasing of the floating gate 16 would be performed by applying the voltage of approximately +17.5 volts to the second current carrying electrode 14 with the control terminal 18 at ground potential.

It should be further noted that during the writing operation the first current carrying electrode 12 is preferably in a floating or open condition.

Figure 2:
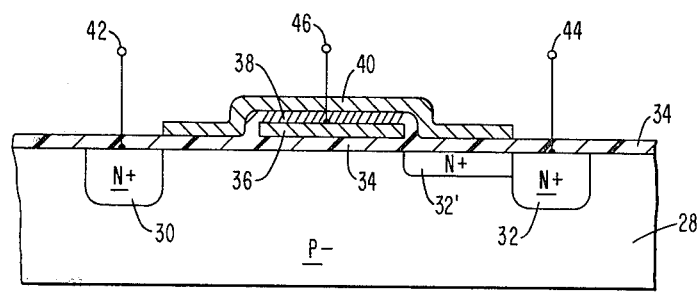
FIG. 2 illustrates a sectional view of an embodiment of the memory cell of the present invention.

In FIG. 2 of the drawings there is illustrated a sectional view of an embodiment of the memory cell of the present invention. This cell includes a semiconductor substrate 28, preferably made of silicon, having first and second current carrying electrodes 30 and 32, 32' with the substrate 28 being preferably P-type and the current carrying electrodes 30 and 32, 32' being N+ type. A first thin insulating layer 34 preferably made of silicon dioxide is formed over the substrate 28 and a control gate 36, preferably made from doped polysilicon, is formed on the silicon dioxide layer 34 extending from the second current carrying electrode at 32' toward the first current carrying electrode 30. Disposed over the control gate 36 is a charge injector 38 which may be similar to the injector system 26 described hereinabove in connection with the first capacitor illustrated in FIG. 1 of the drawings. A floating gate 40, preferably made from a second layer of doped polysilicon, is disposed over the thin silicon dioxide layer 34 and the injector system 38 extending from the first current carrying electrode 30 and overlapping the second current carrying electrode 32'. First, second and third terminals 42, 44 and 46 of the cell are connected to the first current carrying electrode 30, the second current carrying electrode 32, 32' and the control gate 36, respectively. It should be noted that the second current carrying electrode 32, 32' may be a single N+ diffusion, however, two separate diffusion regions are indicated since the second current carrying electrode 32, 32' may be conveniently made in two processing steps by using alignment techniques with respect to the control gate 36 and to the floating gate 40.

It should be noted that the cell of FIG. 2 operates in a manner similar to the operation described hereinabove in connection with the cell of FIG. 1. It can be seen that the capacitor formed by the N+ diffusion 32' and the floating gate 40 is equivalent to the second capacitor 22 in FIG. 1 and that the capacitor formed by the control gate 36 and the floating gate 40 is similar to the first capacitor 20 shown in FIG. 1 of the drawings, with the effective floating gate region on the channel between electrodes 30 and 32, 32' being located between the control gate 36 and the first current carrying electrode 30. It should also be noted that the first current carrying electrode 30 is effectively the source of the transistor having control gate 36 and floating gate 40, with the second current carrying electrode 32, 32' being the drain.

Figure 3:
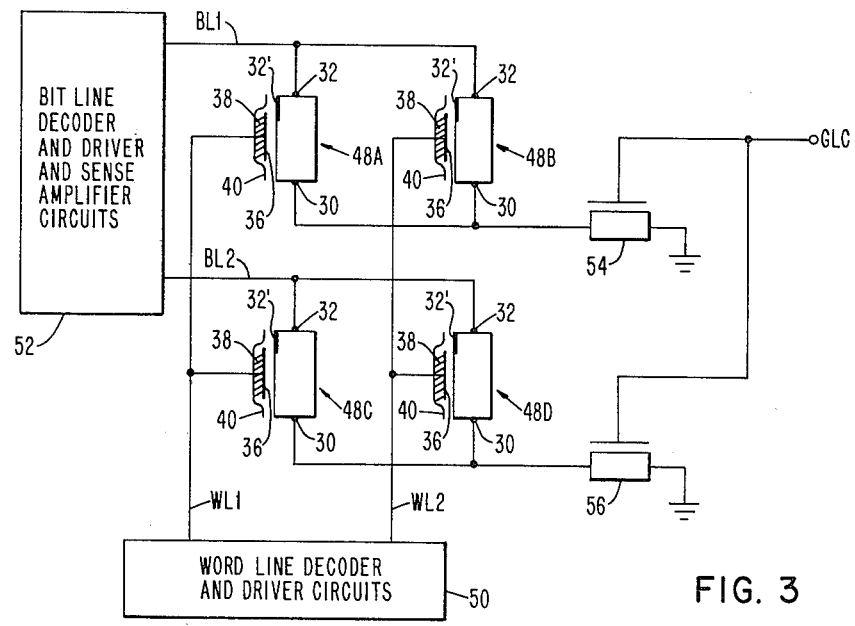
FIG. 3 illustrates a memory system of the present invention having an array of cells each of which may be of the type illustrated in FIG. 2 of the drawings.

A memory system of the present invention having an array with cells 48A, 48B, 48C and 48D is illustrated in FIG. 3 of the drawings. Each of these cells 48A, 48B, 48C and 48D is preferably of the type illustrated in FIG. 2 of the drawings. Elements of the system illustrated in FIG. 3 which are similar to those illustrated in FIG. 2 of the drawings are indicated by the same reference numbers. Word line decoder and driver circuits 50, which may be of any known type, are connected to the control gate 36 of cells 48A and 48C via a first word line WL1 and to the control gate 36 of cells 48B and 48D via a second word line WL2. Bit line decoder and driver and sense amplifier circuits 52, which may be conventional known circuits, are connected to the second current carrying electrode 32, 32' of cells 48A and 48B via a first bit line BL1 and to the second current carrying electrodes 32, 32' of cells 48C and 48D via a second bit line BL2. The first current carrying electrode 30 of cells 48A and 48B are connected to a reference source of potential, such as ground, through a first ground line transistor 54 and the first current carrying electrode 30 of cells 48C and 48D are connected to the source of reference potential through a second ground line transistor 56, with the control gate of the first and second transistors 54 and 56 being connected to a ground line control terminal GLC.

Figure 4:
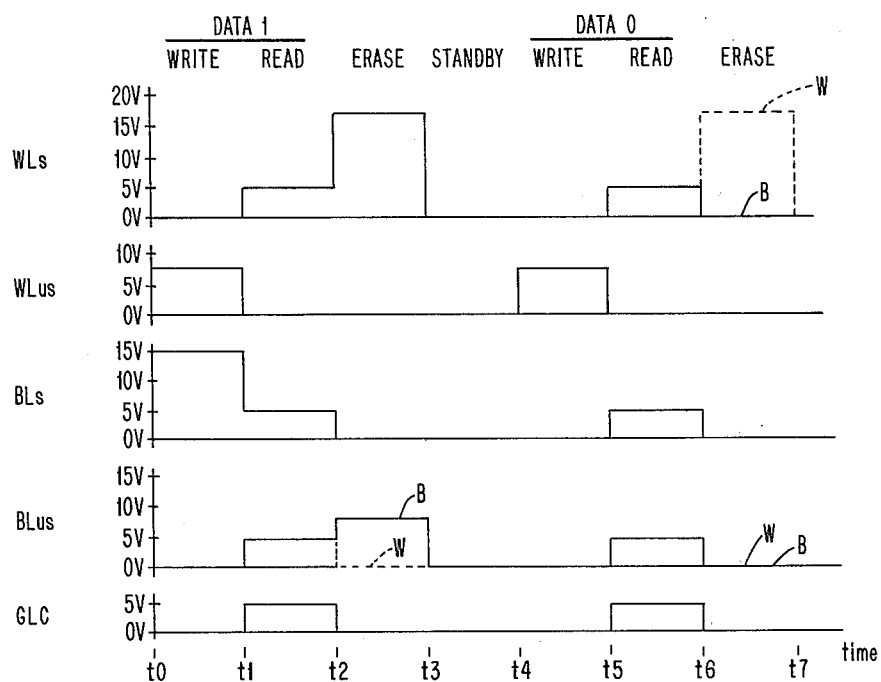
FIG. 4 is a pulse program which may be used to operate the system illustrated in FIG. 3 of the drawings.

In order to more clearly understand the operation of the memory system of the invention illustrated in FIG. 3 of the drawings, reference may be made to the pulse program indicated in FIG. 4. In order to write a data 1, that is a 1 digit of binary information, into cell 48A, a bit line select pulse BLs of approximately 15 volts is applied to the first bit line BL1 and a word line select pulse WLs of zero volts is applied to the first word line WL1, while an unselected word line pulse WLus of approximately 7 volts is applied to the second word line WL2, as indicated in FIG. 4 between times t0 and t1. An unselected bit line voltage BLus of zero volts is applied to the second bit line BL2, with the voltage at the ground line control terminal GLC being at zero volts. Under these conditions electrons will be applied to and stored on the floating gate 36 of only the cell 48A in the manner described hereinabove in connection with the operation of FIGS. 1 and 2 of the drawings. To read the data 1 stored in cell 48A, the pulses indicated in FIG. 4 of the drawings between times t1 and t2 are applied to the system. As can be seen, a pulse WLs of +5 volts is applied to the first word line WL1, a pulse BLs of about +5 volts is applied to the first bit line BL1 and a pulse BLus of approximately +5 volts is applied to the second bit line BL2, along with +5 volts being applied to the ground line control terminal GLC. The pulse WLus is at zero volts and is applied to the second word line WL2. It should be noted that this arrangement of pulses applied to the system selectively reads the information stored in cell 48A without disturbing the information stored in any of the other cells 48B, 48C or 48D. When the information stored in the selected cell 48A is to be erased, a word line select pulse WLs of approximately 17.5 volts is applied to the first word line WL1 with the unselected word line pulse WLus of zero volts being applied to the second word line WL2, as indicated in FIG. 4 of the drawings between times t2 and t3. The selected bit line pulse BLs, at zero volts, is applied to the first bit line BL1 and an unselected bit line pulse BLus is applied to the second bit line BL2. To maintain the memory system in a standby condition all voltages are simply maintained at zero volts with stored charge being retained on the floating gates of the array representing a 1 digit, as indicated in FIG. 4 between times t3 and t4. A data 0 or a 0 binary digit of information is written into the selected cell 48A simply by maintaining, after erasure, all pulses at levels used to write a data 1 except that the bit line select pulse BLs is set at zero volts, as indicated in FIG. 4 between times t4 and t5. The 0 digit of information is read out in the same manner as is the data 1, as indicated in FIG. 4 between times t5 and t6, except that when a data 0 is stored in a selected cell, the channel between the first and second current carrying electrodes 30 and 32, 32' is conductive in view of the lower threshold in the transistor action of the cell due to the absence of charge on the floating gate 36. No action is required to erase the data 0 since the floating gate 36 is not in a charged condition, as indicated between times t6 and t7.

It should be noted that in order to limit the erasure of a 1 digit to only cell 48A, an unselected bit line pulse BLus of approximately 7.5 volts is applied to the second bit line BL2, as indicated in in FIG. 4 at B during erase time t2-t3, but if all cells of the entire word line WL1 are to be erased, then the voltage on all the bit lines including the second bit line BL2 are set at zero volts, as indicated by lines W during erase time t2-t3 and t6-t7 in FIG. 4, with the selected word line pulse WLs being at +17.5 volts.

Accordingly, it can be seen that a selected cell in the memory system of FIG. 3 operates in the same manner as do the cells illustrated in FIGS. 1 and 2 of the drawings, but with the information of the unselected cells, such as cells 48B, 48C and 48D, being undisturbed by applying appropriate voltages to the three terminals of these cells. Because of the compactness of these cells, the memory system of this invention has a very dense array of cells and has an improved performance. Of course, it should be understood that cells 48B, 48C and 48D are selected in a similar manner.

Figure 5:
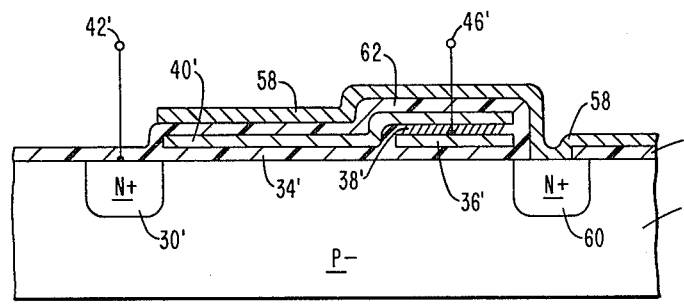
FIG. 5 is a sectional view illustrating another embodiment of the memory cell of the present invention.

In FIG. 5 there is illustrated in a sectional view another embodiment of the memory cell of the present invention similar to that illustrated in FIG. 2 of the drawings with the exception of the arrangement or structure for providing the capacitor which is the equivalent of capacitor 22 illustrated in FIG. 1 of the drawings. In FIG. 5 elements of the cell which are similar to the elements illustrated in the cell of FIG. 2 are referenced by the same number but with a prime. Whereas in the embodiment of FIG. 2, the second current carrying electrode 32', the thin silicon dioxide layer 34 and the floating gate 40 formed the second capacitor 22 illustrated in FIG. 1, in FIG. 5 a bit line 58 which may be a third layer of doped polysilicon or a metal layer, such as copper doped aluminum, contacting the second current carrying electrode 60, extends over the floating gate 40' with an insulating layer 62 being disposed between the floating gate 40' and the bit line 58. It can be seen that by extending the bit line 58 over the floating gate 40' a capacitor having a large capacitance value is provided and the surface area of the cell is decreased. If a larger capacitance is desired, the floating gate 40 and the N+ diffusion 32' of FIG. 2 may also be incorporated into the structure of FIG. 5. This cell operates in the same manner as does the cell illustrated in FIG. 2 of the drawings and may be used, if desired, in the array of the memory system illustrated in FIG. 3 of the drawings.

Figure 6:
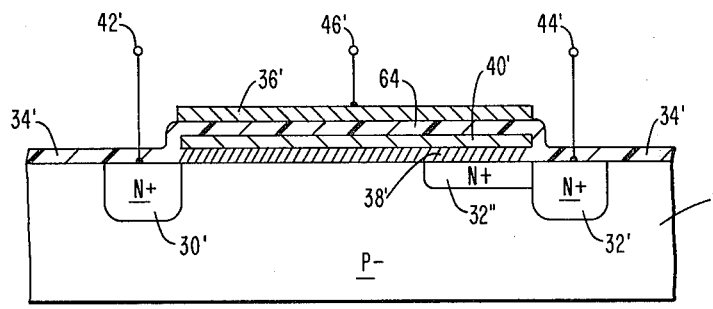
FIG. 6 is a sectional view illustrating a further embodiment of the memory cell of the present invention.

A further embodiment of the memory cell of the present invention is illustrated in FIG. 6. This cell is somewhat similar to that illustrated in FIG. 2 of the drawings and similar elements are identified by the same reference numbers with a prime added. As can be seen this embodiment of the memory cell of the present invention includes a first current carrying electrode 30' and a second current carrying electrode 32', 32" formed in the semiconductor substrate 28'. A charge or electron injector 38' is formed on the surface of the substrate 28' extending from the first current carrying electrode 30' and overlying the N+ region 32" of the second current carrying electrode 32', 32" with the remaining surface of the substrate 28' being covered by a layer of silicon dioxide 34'. Disposed over the injector 38' is a floating gate 40' extending from the first current carrying electrode 30' and overlying the N+ region 32" of the second current carrying electrodes 32', 32". The floating gate 40' may be made of doped polysilicon with a selfinsulating layer of silicon dioxide 64 being formed over the floating gate 40'. Disposed over the insulating layer 64 is a control gate 36', preferably aligned with the floating gate 40'. First, second and third terminals 42', 44' and 46' are connected to the first current carrying electrode 30', the second current carrying electrode 32', 32" and to the control gate 36'.

In the operation of this embodiment of the invention, to store a data 1, i.e., to apply a negative charge on the floating gate 40' which increases the field effect transistor threshold voltage of the cell, a voltage of approximately +15 volts is applied to the control gate 36', with the voltage at the second current carrying electrode 32', 32" being maintained at zero volts, and the first electrode 30' floating or in an open condition. To store a data 0, the floating gate 40' is left uncharged. To erase the cell, the control gate is maintained at zero volts and the second current carrying electrode 32', 32" is maintained at approximately +17.5 volts. It should be noted that the embodiment of FIG. 6 is similar to the circuit illustrated in FIG. 1 of the drawings except that the capacitors 20 and 22 are interchanged such that the capacitor 20 having the low capacitance value and the injector system 26 is connected directly to the second current carrying electrode 14, whereas the capacitor 22 having the larger capacitance and being without an injector system is connected directly to the control terminal 18. It will be noted that because the capacitor formed by control gate 36' and floating gate 40' is large, a large voltage is coupled to the floating gate 40' by applying a voltage to electrode 46'. Hence, either of the two current carrying electrodes 30' or 32', 32" may be used as device source or drain.

It should be understood that the injector systems utilized in the cells of this invention may use single or dual injectors or graded band gap regions. However, if a single injector is used for writing information, a blanket erasure of the cells may be performed by the known use of ultraviolet radiation.

Accordingly, it can be seen that a simple and very compact memory cell has been provided which may be used in an electrically erasable read only memory system or as a non-volatile random access memory by selectively charging and discharging a floating gate of a field effect transistor wherein only three terminals are employed for each of the cells. It should be noted that each of the cells is operated by using a low valued single polarity voltage with high reliability and improved performance.

While the invention has been particularly shown and described with reference to preferred embodiments thereof, it will be understood by those skilled in the art that various changes in form and details may be made therein without departing from the spirit and scope of the invention.

What is claimed is:
1. A system comprising;
   a field effect transistor having, a current carrying electrode, a floating gate and a control gate,
   a first capacitor disposed between said control gate and said floating gate,
   a second capacitor disposed between said current carrying electrode and said floating gate, one of said capacitors having a dual charge injector system having a graded band gap insulator structure and a capacitance value less than that of the other of said capacitors, and
   means for applying pulses to said control gate and said current carrying electrode for selectively charging and discharging said floating gate.
2. A system as set forth in claim 1 wherein said one capacitor has a capacitance value several times that of said other capacitor.
3. A system as set forth in claim 2 wherein said injector system includes an insulator having graded or stepped composition regions near opposite surfaces thereof.
4. A system as set forth in claim 3 wherein a first of said regions is disposed adjacent to said control gate and a second of said regions is disposed adjacent to said floating gate.
5. A system as set forth in claim 1 wherein said insulator structure includes a silicon dioxide layer having graded or stepped composition regions adjacent said control gate and said floating gate.

6. A system as set forth in claim 5 wherein said composition region includes silicon.

7. A system as set forth in claim 4 wherein said first and second regions include silicon.

8. A system as set forth in claim 1 wherein said first capacitor includes said dual charge injector system and a capacitance value substantially less than that of said second capacitor.

9. A system as set forth in claim 9 wherein said second capacitor has a capacitance value several times that of said first capacitor.

10. A memory system comprising;
   a field effect transistor having a floating gate and a current carrying electrode,
   a control terminal,
   a dual charge injector system disposed between said control terminal and said floating gate having a stepped band gap insulator structure and a given capacitance value,
   a capacitor disposed between said current carrying electrode and said floating gate having a capacitance value substantially greater than said given capacitance value,
   means for applying pulses to said control terminal and said current carrying electrode for selectively charging and discharging said floating gate, and
   means for detecting the charge condition of said floating gate.

11. A system as set forth in claim 10 wherein said capacitor has a capacitance value several times that of said given capacitance value.

12. A system as set forth in claim 11 wherein said insulator structure includes graded or stepped composition regions disposed adjacent said control terminal and said floating gate.

13. A system as set forth in claim 12 wherein said insulator structure includes a silicon dioxide layer having graded or stepped composition regions adjacent said control terminal and said floating gate.

14. A system as set forth in claim 13 wherein said composition region includes silicon.

15. A memory system comprising;
   a field effect transistor having a floating gate and source and drain regions defining a channel region,
   a control electrode,
   a dual charge injector system including silicon rich insulating layers disposed between said control electrode and said floating gate, said charge injector system having a given capacitance value,
   a capacitor having a capacitance value substantially larger than said given capacitance value disposed between said drain and said floating gate,
   means for selectively applying voltage pulses to said control terminal and said drain for selectively charging and discharging said floating gate, and
   means including said drain, source and channel regions for detecting charge on said floating gate.

16. A memory system as set forth in claim 15 wherein said control electrode is disposed between a portion of said floating gate and said channel.

17. A memory system as set forth in claim 15 wherein said capacitor is formed by said floating gate and said drain.

18. A memory system comprising;
   an array having a plurality of cells, each including a transistor having a floating gate and source and drain regions, a control electrode, a dual charge injector system having a graded band gap insulator structure and a given capacitance value disposed between said control electrode and said floating gate and a capacitor having a capacitance value substantially greater than said given capacitance value, said capacitor being formed by said drain and said floating gate,
   means for applying pulses between said control electrode and said drain region of each of said cells for selectively charging and discharging said floating gates,
   word line decoder and driver circuits coupled to said control electrode of each of said transistors,
   bit line decoder and driver circuits coupled to said drain region of each of said transistors, and
   a sense amplifier circuit coupled to the source and drain regions of each of said transistors.

19. A memory system comprising;
   a field effect transistor having first and second current carrying electrode diffusions, a control gate and
   a dual charge injector system having a stepped band gap insulator structure and a given capacitance,
   a capacitor serially connected with said injector system having a capacitance substantially larger than said given capacitance, said serially connected injector system and said capacitor being connected between said control gate and one of said diffusions and said floating gate being connected to the common point between said injector system and said capacitor,
   means for applying pulses to said control gate and said one diffusion for charging and discharging said floating gate, and
   means for sensing current flow between said first and second diffusions.

20. A memory system comprising;
   a semiconductor substrate having source and drain diffusions therein defining a channel region in said substrate,
   a control gate disposed between said diffusions over a portion of said channel region,
   a first insulating layer disposed between said substrate and said control gate,
   a floating gate disposed over the remaining portion of said channel,
   a dual charge injector system having a graded band gap insulator structure disposed between said control gate and said floating gate,
   a conductive line disposed over said floating gate and contacting said drain diffusion,
   a second insulating layer disposed between said conductive line and said floating gate,
   means for applying pulses to said control gate and said conductive line for selectively charging and discharging said floating gate, and
   means for detecting the charge condition of said floating gate.

21. A memory system comprising;
   a semiconductor substrate having a pair of spaced apart diffusions formed therein,
   a floating gate disposed between said diffusions and overlapping one of said diffusions,
   a dual charge injector system having a stepped band gap insulator structure disposed between said floating gate and said one diffusion,
   a control gate, an insulating layer disposed between said control gate and said floating gate, means for applying pulses to said control gate and to said one diffusion for controlling charge on said floating gate, and means for detecting the charge condition of said floating gate.

* * * * *

UNITED STATES PATENT OFFICE
CERTIFICATE OF CORRECTION

PATENT NO. : 4,336,603
DATED : June 22, 1982
INVENTOR(S) : Harish N. Kotecha and Francis W. Wiedman, III It is certified that error appears in the above-identified patent and that said Letters Patent are hereby corrected as shown below:

Column 9, Line 11    Delete "claim 9" and substitute therefor --claim 8--.

Column 9, Line 63    Delete "claim 15" and substitute therefor --claim 16--.

Column 10, Line 22    After "and" insert --a floating gate,--.

Signed and Sealed this

Twenty-fourth Day of April 1984

[SEAL]

Attest:

GERALD J. MOSSINGHOFF

Attesting Officer    Commissioner of Patents and Trademarks